US006936854B2

(12) United States Patent
Iwasaki et al.

(10) Patent No.: US 6,936,854 B2
(45) Date of Patent: Aug. 30, 2005

(54) OPTOELECTRONIC SUBSTRATE

(75) Inventors: Tatsuya Iwasaki, Tokyo (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/137,350

(22) Filed: May 3, 2002

(65) Prior Publication Data

US 2002/0167013 A1 Nov. 14, 2002

(30) Foreign Application Priority Data

May 10, 2001 (JP) ........................................ 2001/140183

(51) Int. Cl.[7] .............................................. H01L 33/00
(52) U.S. Cl. .......................... 257/81; 257/84; 257/433; 257/622
(58) Field of Search ............................. 385/14, 49, 88, 385/132; 257/81, 84, 435, 622

(56) References Cited

U.S. PATENT DOCUMENTS

| 5,191,219 | A |   | 3/1993  | Linke ........................ 250/551 |
| 5,343,542 | A | * | 8/1994  | Kash et al. .................... 385/31 |
| 5,357,122 | A |   | 10/1994 | Okubora et al. ............... 257/84 |
| 5,526,449 | A |   | 6/1996  | Meade et al. .................. 385/14 |
| 5,593,335 | A |   | 1/1997  | Suzuki et al. ................. 445/50 |
| 5,684,817 | A |   | 11/1997 | Houdre et al. ................. 372/45 |
| 6,139,713 | A |   | 10/2000 | Masuda et al. ............... 205/206 |
| 6,160,347 | A |   | 12/2000 | Iwasaki et al. ............... 313/545 |
| 6,231,412 | B1 |  | 5/2001  | Kawade et al. ................ 445/3 |
| 6,283,815 | B1 |  | 9/2001  | Iwasaki et al. ............... 445/41 |
| 6,310,991 | B1 |  | 10/2001 | Koops et al. .................. 385/14 |
| 6,317,554 | B1 |  | 11/2001 | Kosaka et al. ............... 385/132 |
| 6,466,708 | B2 | * | 10/2002 | Yokoyama et al. ............ 385/14 |
| 6,586,775 | B2 |  | 7/2003  | Hirayama .................... 257/98 |
| 2001/0006567 | A1 |   | 7/2001  | Yokoyama et al. ............ 385/14 |
| 2002/0109074 | A1 |   | 8/2002  | Uchida ..................... 250/214.1 |
| 2002/0167013 | A1 | * | 11/2002 | Iwasaki et al. ................ 257/79 |

FOREIGN PATENT DOCUMENTS

| JP | 61-28240    |   | 2/1986  |
| JP | 61028240    | * | 2/1986  |
| JP | 5-67770     |   | 3/1993  |
| JP | 6-308519    |   | 11/1994 |
| JP | 8-236885    |   | 9/1996  |
| JP | 10-121292   |   | 5/1998  |
| JP | 2000-56146  |   | 2/2000  |
| JP | 2000-267585 |   | 9/2000  |
| WO | WO 98/53350 |   | 11/1998 |
| WO | WO 98/53351 |   | 11/1998 |

OTHER PUBLICATIONS

A. Chutinan et al., "Highly Confined Waveguides and Waveguide Bends in Three–Dimensional Photonic Crystal," Applied Physics Letters, vol. 75, No. 24, Dec. 13, 1999, pp. 3739–3741

(Continued)

*Primary Examiner*—David Nelms
*Assistant Examiner*—Dao H. Nguyen
(74) *Attorney, Agent, or Firm*—Fitzpatrick, Cella, Harper & Scinto

(57) ABSTRACT

An optoelectronic substrate comprises an electronic device, an optical device, and an optical wiring layer, the optical wiring layer comprising a photonic crystal. An optoelectronic substrate comprises an electronic device, an optical device, and an optical wiring layer, wherein the optical wiring layer is comprised of a periodic structure having a repeating period nearly equal to or smaller than the wavelength of light employed for signal transmission. An optoelectronic substrate comprises an electronic device, an optical device, an electric wiring connected to the electronic device, an optical wiring layer, and a base plate, wherein the optical wiring layer is employed as an insulating layer between the base plate and the electric wiring.

16 Claims, 12 Drawing Sheets

OTHER PUBLICATIONS

H. Masuda, et al., "Photonic Crystal Using Anodic Porous Alumin," Japanese Journal of Applied Physics, vol. 38 (1999), pp. L1403–L1405.

T. D. Happ, et al., "Two-dimensional photonic crystal laser mirrors," Semiconductor Science and Technology, vol. 16 (2001), pp. 227–232.

S. Noda et al., "Trapping and emission of photons by a single defect in a photonic bandgap structure", Nature, vol. 407, pp. 608–610, Oct. 2000.

R.C. Furneaux et al., "The formation of controlled-porosity membranes from anodically oxidized aluminum", Nature, vol. 337, pp. 147–149, Jan. 1989.

* cited by examiner

OPTOELECTRONIC SUBSTRATE

BACKGROUND OF THE INVENTION

1. Field of the Invention

The present invention relates to an optoelectronic substrate, particularly to a circuit substrate having an electronic device and an optical device in combination.

2. Related Background Art

In recent years, data processing apparatuses such as portable telephones and personal digital assistance (PDA) are required to have a high-speed processing ability, a small size, and a light weight simultaneously. However, with increase of the processing speed, the adverse effect of wiring delay has become remarkable. To prevent the wiring delay, the simplest way is to shorten the wirings inside and between the chips. The wire-shortening is also helpful in miniaturizing the substrate, so that many inventions have been disclosed thereon.

However, the increase of the processing speed has given rise to another problem of electromagnetic radiation interference noise (EMI).

The problem of EMI is explained below.

Shortening of the wiring by close arrangement of the electronic parts increases the wiring density. Consequently, when signals flow in a high speed through adjacent wirings, the electromagnetic waves can interfere with each other to cause noises, preventing precise transmission of the signals. In particular, in mobile terminals, which are coming to be driven at a lower voltage and higher electric current intensity, the adverse effect of the EMI is becoming serious.

The adverse effects can be prevented, for example, by making the ceramic substrate multi-layered to increase the electromagnetic radiation noise immunity (EMC) of the respective layers. However, this is not satisfactory in the production cost and yield.

SUMMARY OF THE INVENTION

The present invention provides a novel method for avoiding the above EMI problem. The present invention provides also a substrate having an EMI-avoiding means, and electronic apparatuses employing the substrate.

An embodiment of the optoelectronic substrate of the present invention comprises an electronic device, an optical device, and an optical wiring layer, the optical wiring layer comprising a photonic crystal as a constituent.

Another embodiment of the optoelectronic substrate of the present invention comprises an electronic device, an optical device, and an optical wiring layer, at least a part of the optical wiring layer is comprised of anodized alumina.

In particular, the anodized alumina is employed preferably as an optical coupler between the optical device and the optical wiring.

The optical wiring layer is, for example, a two-dimensional optical waveguide.

The substrate can be constituted to transmit an optical signal inputted from the optical device in plural transmission directions in the optical wiring layer.

The substrate can be constituted to receive the light transmitted through the optical wiring layer from plural directions in the optical wiring layer.

The optical device is preferably a light-receiving element, and at least a part of a light-receiving region of the light-receiving element is preferably buried in the optical wiring layer in view of the light-receiving efficiency.

In still another embodiment, the anodized alumina has plural holes, and at least a part of the holes are filled with an dielectric material, an electroconductive material, a magnetic material, or a combination thereof.

According to another aspect of the present invention, there is provided an optoelectronic substrate comprising an electronic device, an optical device, and an optical wiring layer, wherein the optical wiring layer is comprised of a periodic structure having a repeating period nearly equal to or smaller than the wavelength of light employed for signal transmission.

According to still another aspect of the present invention, there is provided an optoelectronic substrate comprising an electronic device, an optical device, an electric wiring connected to the electronic device, an optical wiring layer, and a base plate, wherein the optical wiring layer is employed as an insulating layer between the base plate and the electric wiring.

The optoelectronic substrate of the present invention comprises an electronic device, an optical device, an insulating member for insulating electrically the above devices, an electric wiring for connecting electrically the electronic devices or the optical devices, and an optical waveguide connecting optically the optical devices, wherein the optical waveguide is comprised of a photonic crystal.

Another embodiment of the optoelectronic wiring substrate of the present invention comprises an electronic device, an optical device, an insulating member for insulating electrically the above devices, an electric wiring for connecting electrically the electronic devices or the optical devices, and an optical waveguide connecting optically the optical devices, wherein an optical coupler is comprised of a photonic crystal.

The waveguide characteristics and the optical coupling characteristics can be controlled by designing suitably the repeating period and the like of the photonic crystal, and thereby the freedom degree in designing the optical circuit like routing can be increased.

Still another embodiment of the optoelectronic wiring substrate of the present invention comprises an electronic device, an optical device, an insulating portion for insulating electrically the above devices, an electric wiring for connecting electrically the electronic devices or the optical devices, and an optical waveguide connecting optically the optical devices, wherein anodized alumina is employed for at least a part of the insulating portion.

In this second embodiment, the anodized alumina insulates electrically the electric devices and the optical devices mounted thereon, and serves as an optical wiring and an optical coupler, whereby the optoelectronic wiring device can be made compact by a simple technique, and further the electromagnetic emission noise can be reduced, enabling high-speed data processing with high reliability.

The anodized alumna has many holes. By designing the fine structure of the holes (hole repeating period, hole arrangement, hole diameter, etc.), the waveguide characteristics, and optical coupling characteristics thereof can be controlled. In particular, the anodized alumina can be changed to a photonic crystal by making the hole arrangement regular.

Further, the heat releasing ability of the optoelectronic wiring substrate can be improved by placing the anodized alumina on a metal base plate such as an aluminum plate. Filling of the anodized alumina holes with an electroconductive material makes the anodized alumina useful as an electric wiring for connecting electrically the electronic devices or the optical devices.

Filling of the anodized alumina holes with a magnetic material makes the anodized alumina useful as an electromagnetic wave absorber, which gives an optoelectronic wiring substrate less sensitive to electromagnetic emission noise. Thus by placing suitably the filled anodized alumina, electromagnetic interference caused by the electromagnetic emission noise can be reduced.

Furthermore, the anodized alumina can be produced in a large area readily at a low cost, advantageously.

DESCRIPTION OF THE PREFERRED EMBODIMENTS (First Embodiment)

An embodiment of the optoelectronic substrate of the present invention is explained below. In the description below, the optoelectronic substrate is occasionally referred to as an "optoelectronic wiring substrate", but the both terms indicate the same thing.

Figure 12:
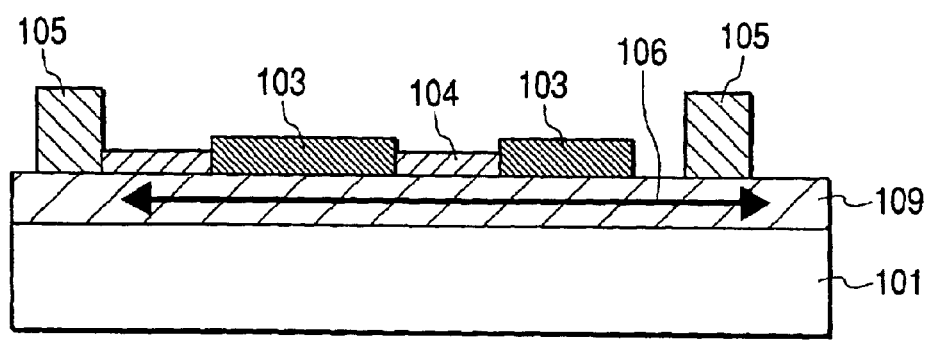
FIG. 12 is a schematic sectional view for explaining an example of an optoelectronical wiring substrate corresponding to Embodiment 1 of the present invention.

FIG. 12 is a schematic sectional view for explaining an example of an optoelectronic wiring substrate of the present invention. In FIG. 12, the numeral 101 indicates a base plate; 109, a periodic structure such as a photonic crystal; 103, an electronic device formed on the surface of the photonic crystal; 104, an electric wire serving as an optical wiring layer formed on the photonic crystal: and 105, an optical device. The arrow 106 shows schematically the transmission of light through the photonic crystal.

In FIG. 12, although plural electronic devices and plural optical devices are formed on base plate 101: the respective devices need not necessarily be provided in plurality.

(Photonic Crystal)

The term "photonic crystal" means a structure constituted of a periodic structure of a unit size nearly equal to or less than the wavelength of the light transmitted between the aforementioned optical device and the optical wiring layer. The photonic crystal like this is described in detail by Baba (O plus E, 1999, December, p.1524–1532 (Vol.21, No.12)).

The photonic crystal is constituted of portions having different refractivities (dielectric constants) arranged periodically, having optical properties controlled thereby.

Figure 13A:
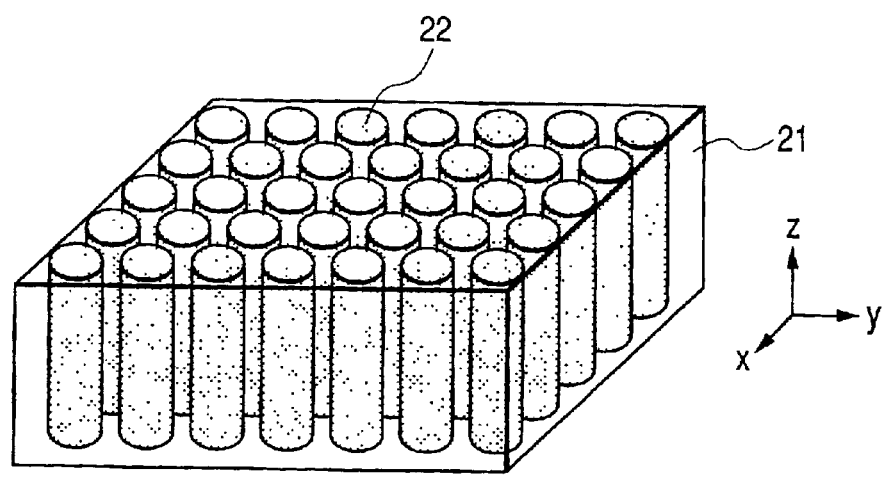
FIGS. 13A, 13B, and 13C are schematic perspective views of examples of the photonic crystal.

An example is a two-dimensional photonic crystal as shown in FIG. 13A. This photonic crystal has, in a first dielectric portion (dielectric material), columnar second dielectric portions (dielectric material) arranged two-dimensionally.

In such a medium, photonic bands are formed by the periodicity of refractivity in a periodic structure size of a light wavelength or less, as is analogized from the formation of bands in a semiconductor for electronic wave by dispersion relation between energy E and wave number k in Bragg reflection in the band formation theory.

Depending on the periodic structure, a photonic band gap, which is a wavelength region where light cannot exist, is formed to result in higher optical reflectivity.

For utilizing the photonic band, the structural repeating period should be in a size of a fraction of the wavelength of the introduced light.

The photonic band of the photonic crystal can be controlled by the construction, the constituting material, and so forth thereof. Since the structural repeating period and the wavelength obey the scale law, the photonic band and the photonic band gap can be formed for a desired wavelength region by controlling the structural repeating period.

Figure 7A:
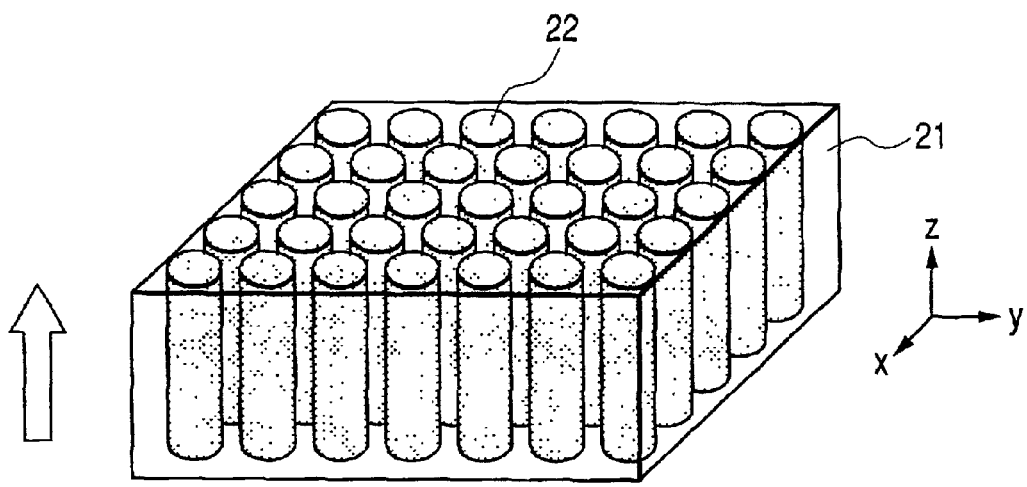
FIGS. 7A, 7B, and 7C show a two-dimensional photonic crystal.

The periodic structure of the present invention, namely the photonic crystal, is exemplified by a 2D photonic crystal having periodicity in two-dimensional directions (x and y directions). For example, as shown in FIG. 7A or FIG. 13A, in a first dielectric material 21, columns of a second dielectric material 22 are regularly arranged two-dimensionally. In FIG. 13A, the first material (refractive index: n1) surrounding the holes, and the holes per se or the second material (refractive index: n2) filled in the holes have a relation of n1>n2, or n1<n2. Naturally, plural kinds of materials having different dielectric constants may be employed for filling the holes. For example, holes in a first region are filled with a second dielectric material and the holes in a second region are filled with a third dielectric material (the third dielectric material having a refractive index different from that of the second dielectric material). The first region and the second region of the holes may be separate from each other or may be superposed partly.

Figure 13B:
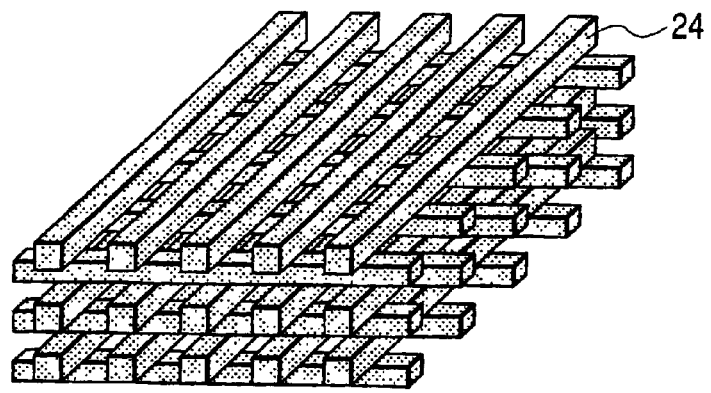
Figure 13C:
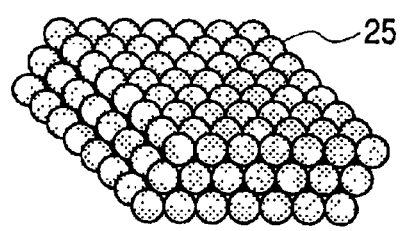

Other examples of the structure are 3D photonic crystals having periodicity in three-dimensional directions, including structures having piled dielectric bars 24 as shown in FIG. 13B, and structures having dielectric spheres 25 piled as shown in FIG. 13C.

Figure 7B:
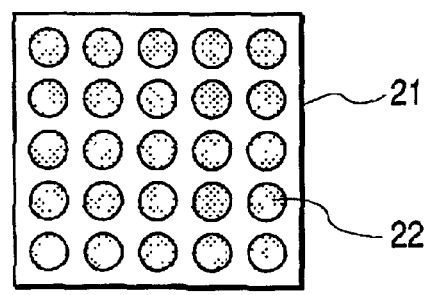
Figure 7C:
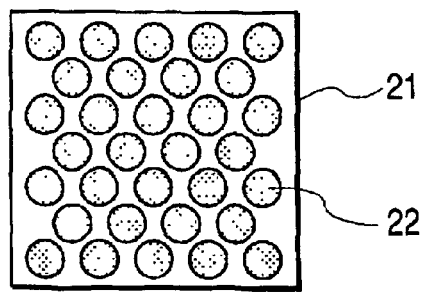

The periodic structures of the two-dimensional photonic crystal include those of square lattice arrangement as shown in FIG. 7B, and those of triangular lattice arrangement as shown in FIG. 7C. For making the photonic band gap widened, preferred are triangular lattice arrangement of a regular honeycomb structure having six-directional symmetry as shown in FIG. 7C.

The periodic structure of the present invention, namely the photonic crystal, is constructed from two or more materials. The constituting materials are not limited, provided that the refractive indexes are different from each other. The material therefor includes glass materials, semiconductor materials, oxide materials, metal materials, and organic materials.

The air or vacuum can be regarded as a constituting material. For example, a photonic crystal can be prepared by arranging dielectric bars or dielectric spheres in the atmospheric air.

In the present invention, a fine optical circuit can be constructed by employing the photonic crystal as the optical waveguide or the optical coupler to control the characteristics. The repeating period of the periodic structure for intercepting the light in the optical waveguide is, for example, in the range of 5 to 20 period for sufficient reflectivity, depending on the structure of the photonic band. Owing to such properties of the photonic crystal, the breadth (thickness) between the optical waveguide is adjusted to be several ten times the wavelength. Thereby, an optical circuit can be realized with a high density and fineness.

In the present invention, the transmission of light can be controlled in various ways by utilizing the specific dispersion relation caused by the periodic structure, namely the photonic band structure. For example, when the photonic band gap is widened at the wavelength region of the transmitted light, the light is not transmitted. Thus an optical circuit can be constructed as desired by designing transmission wavelength regions and non-transmission wavelength regions by utilizing this effect.

The direction of the light propagation can be limited by utilizing the anisotropy of the photonic band. The light can be allowed to propagate selectively in three directions, four directions, and so forth of 360 degree in the plane. Such characteristics are advantageous in widening the application fields of the optical circuit employing the two-dimensional optical waveguide.

In the present invention, the photonic crystal is employed at least as a part of the optical waveguide. A cladding layer 305 may be provided on the upper face or lower face of the optical waveguide layer (FIG. 3C).

In this embodiment, a periodic structure which is constituted of repeated structural units in a repeating period shorter than the wavelength of the light employed for the optical coupling is provided to control the transmission or coupling of light, which enables formation of an optical circuit with a high freedom degree.

In the optical waveguide formed from an insulating material in a periodic structure, the insulating member has simultaneously a function of electric insulation and a function of optical waveguide for optical connection between the optical devices.

In the example shown in the drawing, an optical waveguide constituted of a periodic insulating structure is provided on a base plate. Thereon, are placed an electronic device, an optical device such as light-emitting element and a light receiving elements, and an electric circuit to construct an electric circuit and to construct an optical circuit through an optical waveguide between optical devices. Thus, an optoelectronic wiring substrate is prepared in which an electric circuit and an optical circuit coexist.

(Electronic Device)

Electronic device 103 includes electric parts such as resistances and condensers; and IC and LSI chips such as CPU, RAM, and RF oscillators. Optical device 105 includes light-emitting elements such as laser diodes, and LED; light-receiving elements such as photodiodes; and modulation elements such as electro-optical modulating elements. Although the electronic device and the optical device are described as separate devices, the optical device and the electronic device may be integrated into an optoelectronic chip.

(Base Plate)

The material for base plate 101 includes metals such as aluminum, and SUS; semiconductor materials such as Si, and GaAs; insulating materials such as glass; resins such as PMMA, and polyimides; and flexible material such as plastics. The periodic structure itself may be used as the base plate without employing an additional plate, when it has sufficient thickness to support itself.

(Electric Wiring)

Electric wiring 104 can be prepared, in one method, by printing an electric pattern with an electroconductive paste of Cu, Ag, Au, and the like on an alumina base plate, and baking or curing the electroconductive paste to form a circuit conductor: in another method, by laminating a metal foil such as electrolytic copper foil on a base plate and etching chemically the metal foil by use of an etching resist in a prescribed pattern to form a circuit conductor pattern.

(Optical Coupling Between Optical Device and Optical Wiring Layer)

The optical coupling between the optical device and the optical waveguide is explained below. The optical coupling between the optical device and the waveguide may be made with a lens or a prism, but may be made with a periodic structure, namely a photonic crystal, for the purpose of miniaturizing the optoelectronic wiring substrate and decreasing the number of the parts.

In the optical circuit employing the optical sheet described later, both of the light-emitting device and the light-receiving device are preferably capable of emitting or receiving the light in 2D multiple directions.

With a usual prism used as the light coupler, the direction of light emission and light receiving are limited in one direction. However, with the photonic crystal, light can be emitted or received in multiple directions. Therefore, use of the photonic crystal as the optical sheet or an optical coupler achieves both merits, and is preferable as the application of the optical sheet. In particular, the optical coupling between the optical wiring layer and the optical device can be achieved effectively when optical wiring layer is the one formed by anodization.

FIGS. 3A to 3D illustrate schematically the optical coupling. In these drawings, the numeral 301 indicates a light-emitting element; 302, a light-receiving element; 303, an optical waveguide; 304, a clad layer; 305, an optical coupler; 101, a base plate; 102, an anodized alumina; and 106, a transmitted light.

In the case where the periodic structure is used as the waveguide and optical coupler, the optical coupler is formed by changing locally the microstructure in the photonic crystal.

The optical coupling can be made by modulating the construction of the periodic structure (defects in the structure, modulation of the periodicity, filling of different kind of materials, and so forth). In an example thereof, the light guided through a crystal is taken out upward by utilizing structural defects (Noda: "Nature" No.408, p.608 (2000)).

Figure 15:
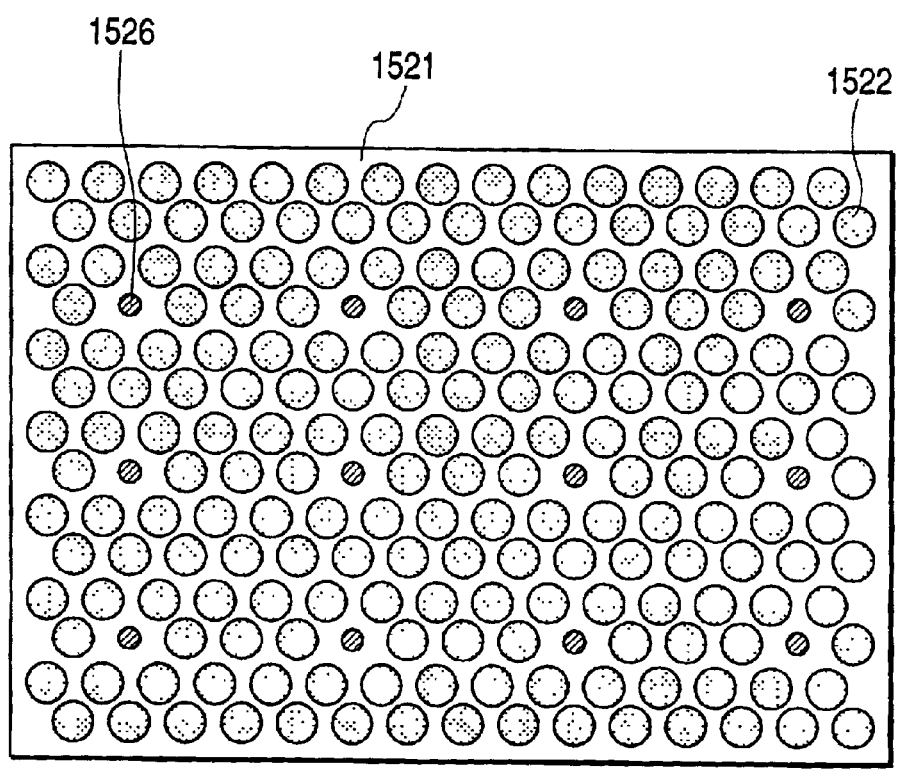
FIG. 15 illustrates an example of the periodic structure having defects.

Such a construction can be obtained by forming preliminarily a modulated structure for the optical coupler, or preliminarily preparing a periodic construction as the optical waveguide and filling a different material into a part thereof to cause structural modulation. FIG. 15 illustrates an example of introduction of defects into a two-dimensional periodic structure. Such a construction can be formed by a simpler method. 2D photonic crystal is preferred in view of the ease of construction.

FIGS. 3A to 3D are sectional views illustrating schematically application of the periodic structure to the optoelectronic wiring in the present invention.

In FIGS. 3A to 3D, the periodic structure is constituted of anodized alumina 102. However any other periodic structure may be used.

Figure 3A:
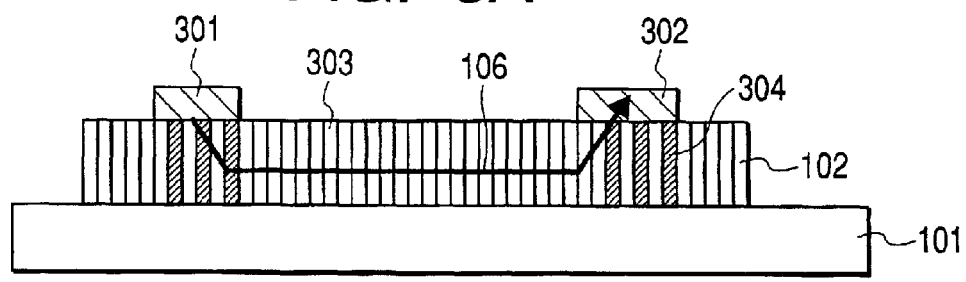
FIGS. 3A, 3B, 3C, and 3D are sectional views illustrating a method of application of anodized alumina onto the optoelectronic wiring of the present invention.
Figure 3B:
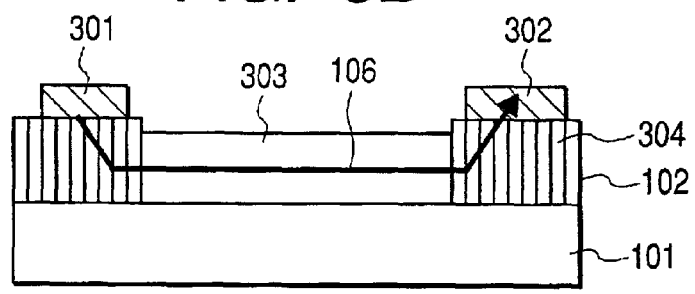
Figure 3C:
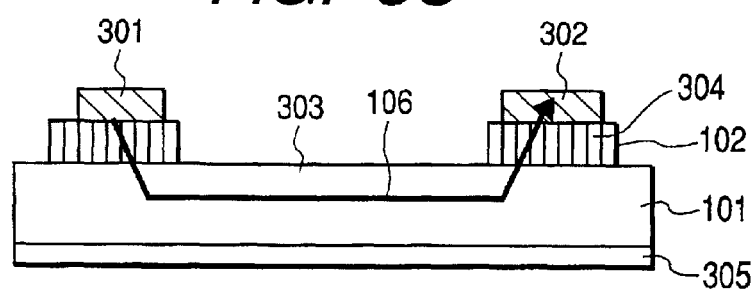
Figure 3D:
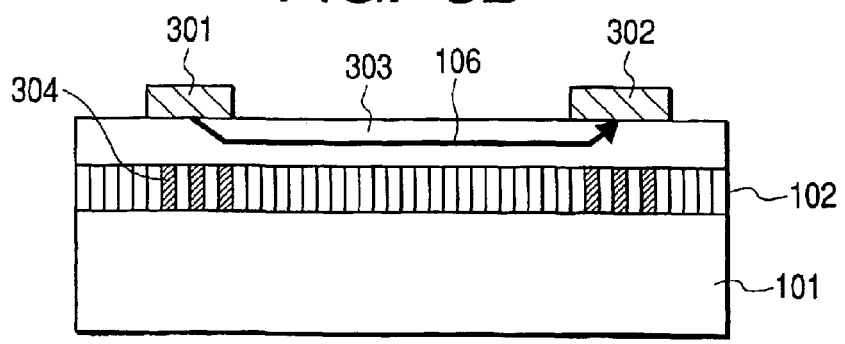

FIG. 3A illustrates an example employing the periodic structure as a waveguide and an optical coupler. FIGS. 3B, 3C, and 3D illustrate the examples in which a periodic structure is placed as the optical coupling portion, and the optical waveguide is separately provided. In FIG. 3B, the optical waveguide and the periodic structure are placed on a base plate. In FIG. 3C, the periodic structure as the optical coupler is placed on the optical waveguide. In FIG. 3D, the waveguide is placed on the periodic structure.

In the cases of FIGS. 3B, 3C, and 3D, the optical waveguide may be formed from any material such as glass, a semiconductor, and an organic substance. Use of the periodic structure as the waveguide as shown in FIG. 3A is advantageous for miniaturization of the optoelectronic wiring substrate, decrease of the numbers of the parts, and simplicity of the production.

A regular arrangement of the holes enables the anodized alumina to be regarded as two-dimensional photonic crystal as described below. That is, from the periodic structure, namely the photonic crystal, the optical circuit can be constructed by suitably designing the photonic band. Employing anodized alumina makes it possible to fabricate easily the two-dimensional periodic structure having a high aspect ratio extending over a large area, i.e. 2D-photonic crystal, by means of anodization, which is a simple method.

Figure 8:
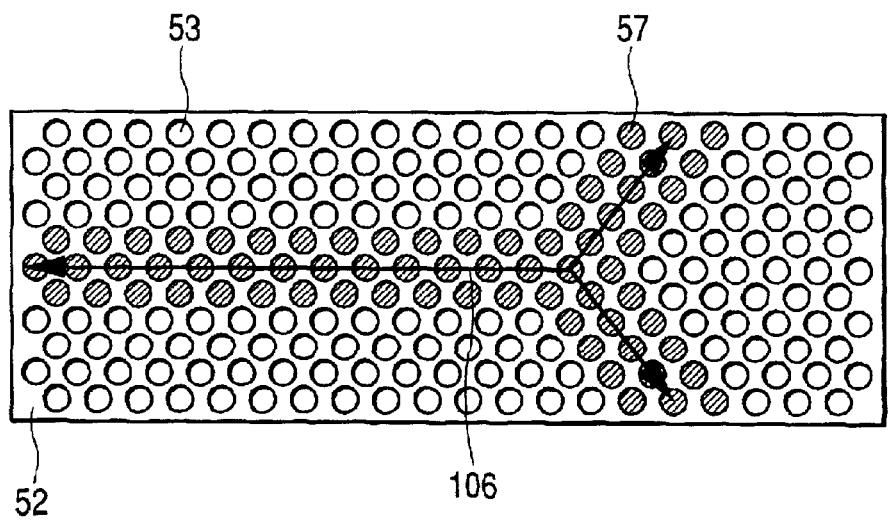
FIG. 8 explains an example of formation of a waveguide by filling a dielectric material into some of the holes.

For constituting the optical circuit, the photonic crystal is used as a line waveguide to connect devices. By patterning the waveguide, the devices are connected as desired. For use of the photonic crystal as the waveguide, fine structure of the photonic crystal may be changed locally instead of the patterning. For example, as shown in FIG. 8, some of holes are filled with another kind of material. Otherwise, in a similar two-dimensional photonic crystal, the sizes of the fine holes are changed for the waveguide portion.

Figure 6:
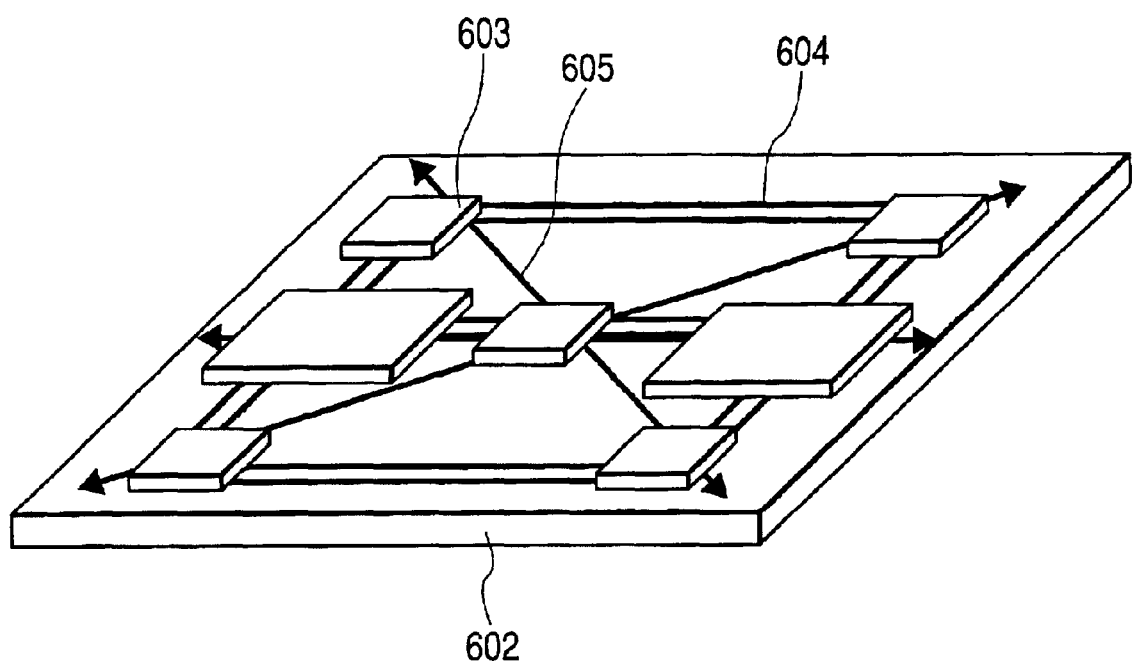
FIG. 6 is a schematic perspective view illustrating an optical sheet.

The optical circuit is preferably constituted from the two-dimensional optical waveguide (hereinafter referred to as an "optical sheet") FIG. 6 illustrates schematically an example of the optical sheet. This optical sheet constitutes a two-dimensional waveguide (sheet-shaped waveguide) for optical wiring. On this optical sheet, the optical devices are placed at prescribed positions to transmit from one point to all the optical devices two-dimensionally. Thereby, in this optical sheet, the optical devices are capable of transmitting the light in plural directions of the two-dimensional optical waveguides, or capable of receiving the light from plural directions of the two-dimensional optical waveguides. Such an optical sheet is preferred to the line waveguide, namely the optical wiring, by the reasons shown below.

The optical wiring is advantageous in prevention of electromagnetic radiation noise. However, the physical dimension of the optical waveguide for one wire is larger by one decimal digit or more than electric wiring. Therefore, entire change of the electric wiring to the optical wiring causes increase of the size or increase of the loss by bending disadvantageously. Further, introduction of the optical wiring requires change of the electric wiring pattern disadvantageously.

The optical sheet has the electric wiring and the optical wiring placed separately thereon and serves as a two-dimensional optical waveguide, enabling transmission of information between optical devices without affecting the design of the electric wiring. As described before, in the optical circuit employing the optical sheet, the light-emitting device and the light-receiving device are preferably capable of emitting or receiving the light in 2D multiple directions (plural directions). In this respect, the photonic crystal employed as the optical waveguide or the optical coupler enables light emission and light reception in multiple directions with technical suitability.

Next, the process for producing the periodic structure, namely the photonic crystal, of the present invention is described below.

One method for producing the periodic structure is a patterning method employing a semiconductor processing technique such as electron beam lithography, and photolithography and etching of a semiconductor processing technique. In this method, the structure can be formed by preparing a prescribed pattern and etching or selective growth.

Another effective method is light exposure and processing with a femtosecond laser. This method is effective for formation of three-dimensional structure.

Such methods, however, has disadvantage in yield and equipment cost in patterning. To offset the disadvantage, a regular nano-structure spontaneously formed may be employed as described later, including, for example, self-organizing arrangement of anodized alumina and dielectric spheres.

(Second Embodiment)

A second embodiment of the present invention is described below in which anodized alumina is employed as the optical waveguide constituting an optical wiring layer.

The anodized alumina is sufficiently effective as the optical waveguide. Further, the anodized alumina of a photonic crystal structure having a regular hole arrangement will function in the same manner as shown in First Embodiment above.

Figure 1A:
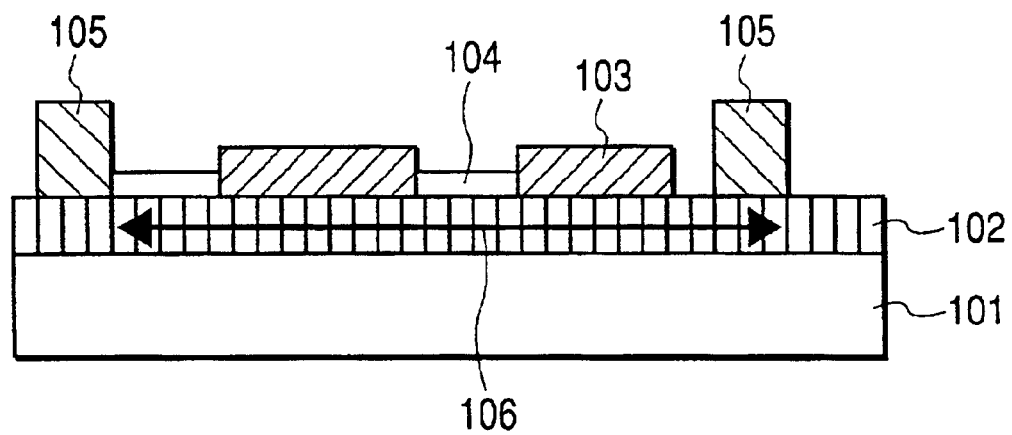
FIGS. 1A and 1B are schematic sectional views of examples of the optoelectronic wiring substrate of the present invention.

In this embodiment, an electronic device, an optical device, and electric wiring are provided on a substrate having an anodized alumina layer formed thereon as shown in FIG. 1A. The anodized alumina has a function of an insulating layer and a function of an optical waveguide to couple optically the optical devices. The anodized alumina works as the optical wiring layer.

Figure 1B:
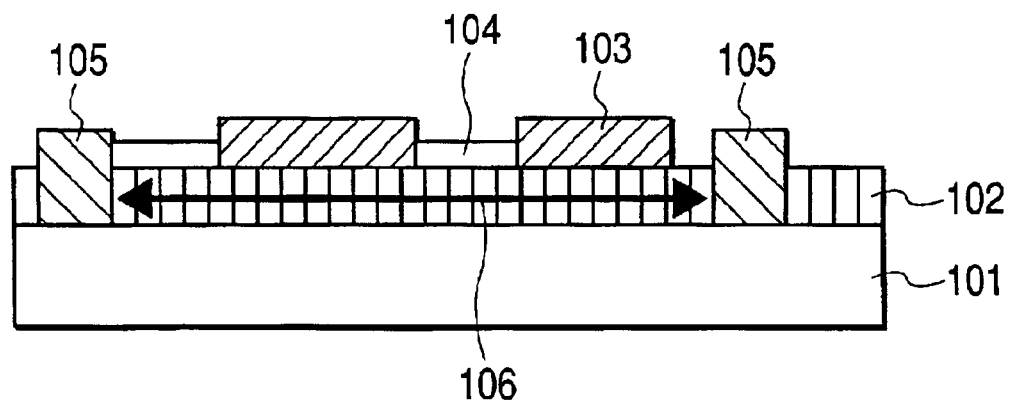

The anodized alumina which has an insulating property insulates electrically the devices. An electric circuit can be formed by forming electric wiring thereon. Further thereon, an optical circuit can be formed by placing a light-emitting element and a light-receiving element and transmitting light through the anodized alumina. The optical device may be implanted in the anodized alumina as shown in FIG. 1B. In particular, the light-receiving part of the light-receiving element is preferably implanted in the optical waveguide.

The electronic device, the optical device, and the electric wiring may be the same as those in First Embodiment.

The base plate may be made of aluminum, since the anodized alumina can be formed by anodization of the aluminum base plate (or film). Otherwise, an aluminum film is formed on an arbitrary base plate, and the aluminum film is anodized.

The material for the base plate includes metals such as aluminum, and SUS; semiconductor materials such as Si, and GaAs; insulating materials such as glass; and resins such as PMMA, and polyimides. The anodized alumina itself may be used as the base plate as shown in FIG. 2A, provided that it has sufficient thickness to support itself.

As the materials for the base plate, metals having a high thermal conductivity are preferred in view of the heat release. Since the anodized alumina is prepared by anodization of aluminum, use of aluminum plate is preferred as the base plate for simplicity of the substrate preparation.

Figure 2A:
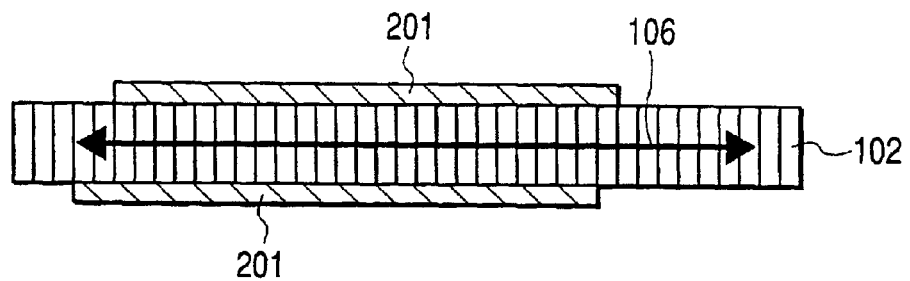
FIGS. 2A and 2B are schematic sectional views of other examples of the optoelectronic wiring substrate of the present invention.
Figure 2B:
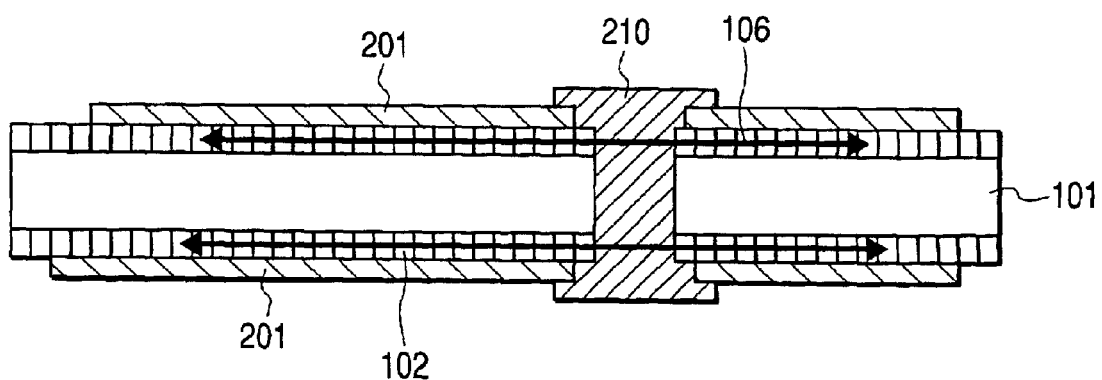

FIGS. 2A and 2B are schematic sectional views of other examples of the optoelectronic wiring substrate of the present invention.

In FIG. 2A, circuits 201 are placed on the upper face and the lower face of the anodized alumina base plate. The anodized alumina works as the optical wiring layer and insulating layer between the upper and lower circuits. The circuits here is constituted of electronic devices, optical devices, electric wirings, and so forth.

In FIG. 2B, anodized alumina layers 102 are provided on the both faces of base plate 101 (e.g., aluminum), and circuits 201 are formed thereon. In such a case, via hole 210 is provided to connect electrically the circuits on the both faces.

The anodized alumina may be coated further with a resin or the like, if necessary.

FIGS. 3A to 3D are sectional views illustrating schematically application of the periodic structure to the optoelectronic wiring in the present invention.

FIG. 3A illustrates an example in which anodized alumina 102 is employed as a waveguide as well as and an optical coupler. FIGS. 3B, 3C, and 3D illustrate the examples in which an anodized alumina is placed at the optical coupling portion 304, and the optical waveguide 303 is separately provided. In FIG. 3B, the optical waveguide and the anodized alumina are placed on base plate 101. In FIG. 3C, the anodized alumina as the optical coupler is placed on optical waveguide layer 101. In FIG. 3D, the waveguide layer is placed on the anodized alumina.

In the case of FIGS. 3B, 3C, and 3D, the optical waveguide may be formed from any material such as glass, a semiconductor, and organic substance. Use of the anodized alumina as the waveguide as shown in FIG. 3A is advantageous for miniaturization of the optoelectronic wiring substrate, decrease of the numbers of the parts, and simplicity of the production.

The anodized alumina in which holes are formed in regular arrangement can be regarded as a two-dimensional photonic crystal as described later.

Thus, an optical circuit can be constructed by designing suitably the photonic band. The anodized alumina produced by a simple technique of anodization can work as a two-dimensional periodic structure, namely 2D photonic crystal, with high aspect in a large area.

For constituting the optical circuit, the anodized alumina is used as a line waveguide to connect devices. By patterning the waveguide, the devices are connected as desired. For use of the anodized alumina as the waveguide, fine structure (hole repeating period, hole arrangement, hole diameter, etc.) of the anodized alumina may be changed locally instead of the patterning. Otherwise, as shown in FIG. 8, holes 53 at the prescribed positions are filled with a dielectric material such as a resin. In FIG. 8, the numeral 52 indicates anodized alumina, and the numeral 106 indicates light transmission direction.

The anodized alumina, which is useful as a two-dimensional photonic crystal, is preferably utilized as the aforementioned two-dimensional optical waveguide (hereinafter referred to as an "optical sheet").

The optical sheet may have an electric wiring and an optical wiring placed separately thereon for use as a two-dimensional optical waveguide to transmit information between optical devices without affecting the design of the electric wiring. In the optical sheet, at a device level, the light-emitting device and the light-receiving device are preferably capable of emitting or receiving the light in 2D multiple directions. With a usual prism as the light coupler, the direction of light emission and light receiving are limited in one direction. However, with the anodized alumina in which the holes are arranged two-dimensionally, light can be emitted or received in many directions. Therefore, use of the anodized alumina as the optical sheet or an optical coupler is preferred as the application of the optical sheet.

The optical coupling between the optical device and the waveguide may be made with a lens or a prism, but is preferably made with anodized alumina for the reason of miniaturization of the optoelectronic wiring substrate, decrease of the number of the parts, and simplicity of production process. Effective optical coupling can be achieved by suitably designing the two-dimensional construction of the anodized alumina. As one guide for the design, the holes (or the filler in the holes) are regarded as light scattering bodies, and the size of the hole is adjusted to cause effective scattering to achieve effective optical coupling. As another guide for the design, the holes are arranged regularly in two dimensions, and the hole arrangement is regarded as a two-dimensional grating coupler element in designing the higher coupling. As still another guide for the design, the anodized alumina may be regarded as a photonic crystal, and structural defects may be introduced for effective optical coupling.

In the case where the anodized alumina is employed as a waveguide and optical-coupler, the fine construction (hole repeating period, hole arrangement, hole diameters, etc.) is changed locally to form the optical coupling portion, or a dielectric material is filled into holes at a prescribed positions to form the optical coupling parts.

The anodized alumina is explained below in detail.

The anodized alumina is produced by anodizing an aluminum film, an aluminum foil, or an aluminum plate in a specified acidic solution (e.g., R. C. Furneaux, W. R. Rigby, & A. P. Davidson: "Nature", vol.337, p.147 (1989)).

Figure 9:
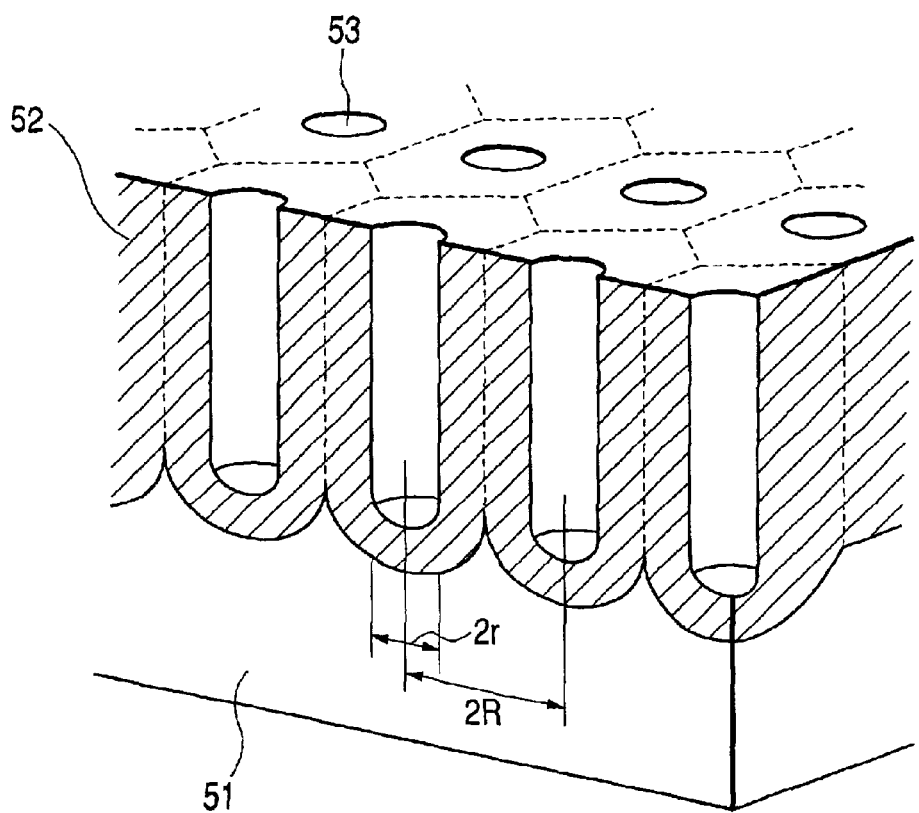
FIG. 9 is a schematic view showing the state of the anodized alumina.

FIG. 9 illustrates schematically a state of anodized alumina. This anodized alumina 52 is mainly composed of Al and oxygen, and has many columnar nanoholes 53. The nanoholes are directed vertically, and are arranged in parallel to each other at a constant repeating period. The diameter 2r of the alumina nanoholes ranges from several nanometers to several hundred nanometers, and the repeating period 2 R thereof ranges from about several ten nanometers to about 500 manometers. The diameter and the repeating period can be controlled by anodization conditions. The thickness of anodized alumina layer 52, and the depth of the nanoholes can be controlled by anodization time length and other conditions. The thickness is usually in the range from 10 nm to 500 $\mu$m.

The anodized alumina in which the holes are regularly arranged can be regarded as a photonic crystal, as mentioned before.

The photonic crystal is constituted of portions having different refractivity (dielectric constant) arranged priodically, having optical properties controlled thereby. The anodized alumina is constituted of a first dielectric portion (alumina) and second dielectric portions in a column shape arranged regularly therein, and can be regarded as a photonic crystal. The photonic band of the photonic crystal can be controlled by the construction, the constituting material, and so forth. Since the structural repeating period and the wavelength obey the scale law, the photonic band can be set in a desired wavelength region by controlling the structural repeating period. The structural repeating period, or the hole intervals, of the anodized alumina can be controlled by hole formation conditions in the range from several ten nanometers to about 500 nm. Therefore the anodized alumina can be used as a photonic crystal in the wavelength range from ultraviolet to infrared. Furthermore, the anodized alumina can be produced by a simple technique of anodization as a two-dimensional periodic structure, namely 2D photonic crystal, with high aspect in a large area.

For use as a waveguide, the anodized alumina has preferably the holes arranged regularly in view of the transmittance. The regular hole arrangement in the alumina can be achieved by utilizing hole-starting points.

Figure 10A:
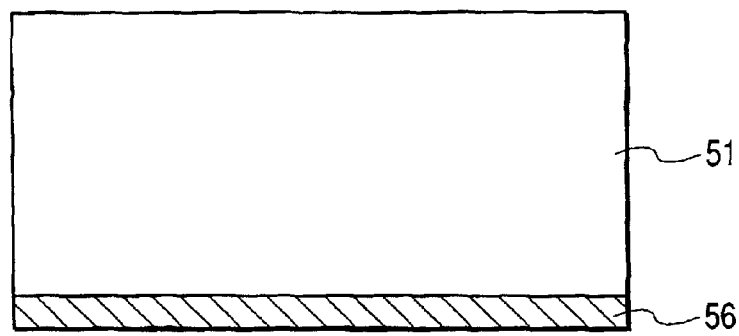
FIGS. 10A, 10B, and 10C illustrate a process for forming anodized alumina having regular hole arrangement.
Figure 10B:
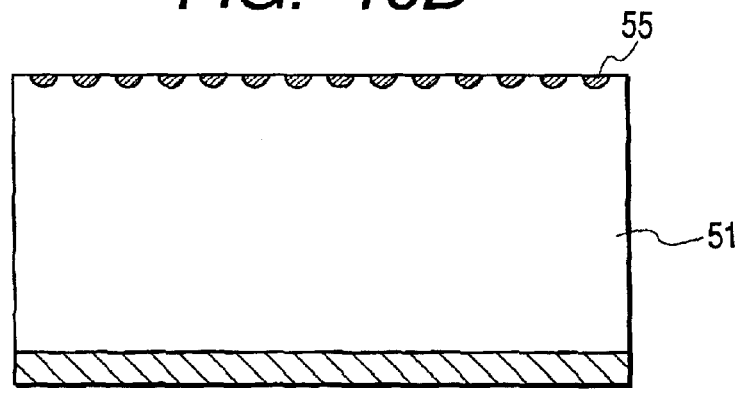
Figure 10C:
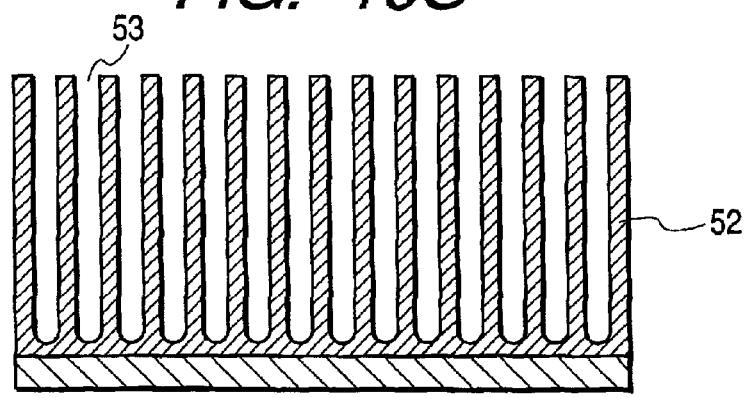

A method for preparing the anodized alumina having the regular hole arrangement is explained by reference to FIGS. 10A to 10C.

In a preliminary step, concaves are formed as hole-starting points 55 on the surface of aluminum film 51. Supporting member 56 shown in FIG. 10A may be omitted.

By working of the surface of aluminum film 51, the holes in the alumina can be formed in a regular arrangement such as in a triangular lattice arrangement (Masuda: "Optronics", No.8, (1998) 211).

In anodized alumina 52, the holes tend to be arranged in a triangular lattice by self organization in the anodization process. Therefore, the arrangement of the hole-starting points is preferably in a triangular lattice. However, any other hole arrangement is possible such as square lattice arrangement.

The method of formation of hole-starting points 55 (concaves) includes irradiation of a focused ion beam (FIB), treatment with SPM such as AFM, concave formation by press patterning as disclosed in Japanese Patent Application Laid-Open No. 10-121292, concave formation by resist pattern formation and subsequent etching.

Of the above methods, the focused ion beam irradiation method is particularly preferred, since this method does not require the troublesome steps such as resist application, electron beam projection, and resist removal; hole-starting points 55 can be formed at prescribed positions by direct pointing; and no pressure is applied to the working object, enabling working an object having low mechanical strength.

The preliminary step for forming a regular hole arrangement is explained above. If the hole arrangement need not be regular, the preliminary step may be omitted.

Figure 11:
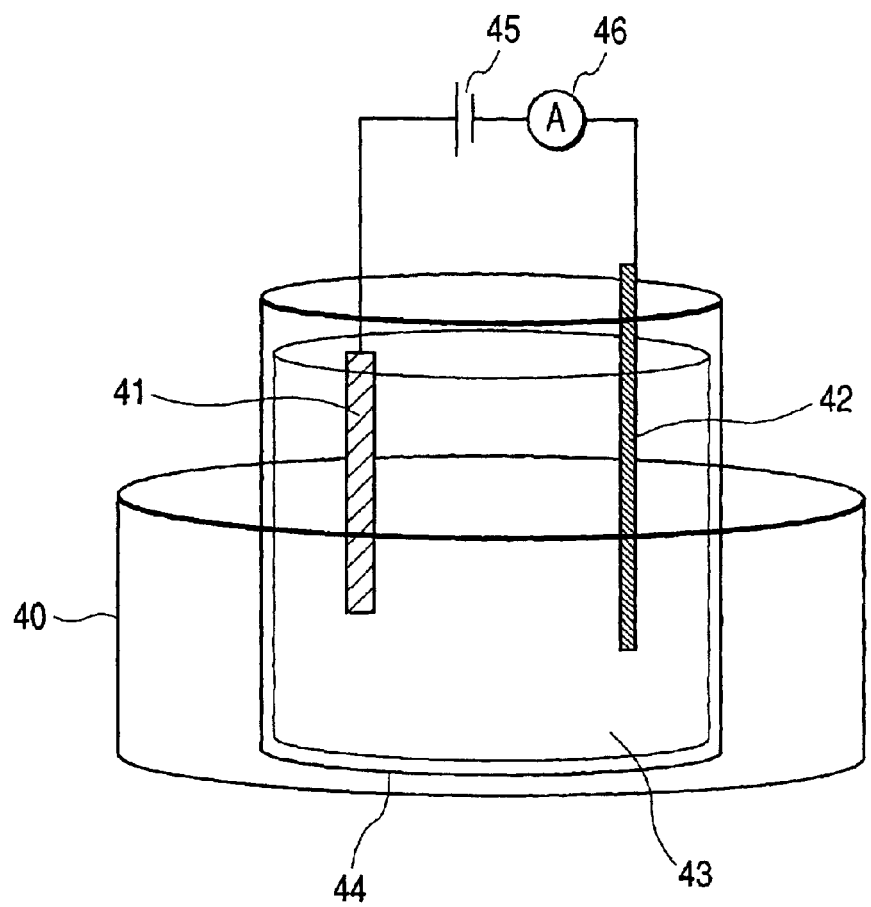
FIG. 11 illustrates schematically an apparatus for anodization.

Subsequently, anodization is conducted. The anodization can be practiced with an apparatus shown in FIG. 11. In FIG. 11, the numeral 40 indicates a constant temperature bath; 41, a specimen; 42, a Pt plate as the cathode; 43, an electrolyte solution; 44, a reaction vessel; 45, a power source for applying anodization voltage; and 46, an ammeter for measuring the anodization current. Although omitted in the drawing, the apparatus include further a specimen holder, and a computer for automatically controlling and measuring the voltage and the electric current. Specimen 41 and cathode 42 are placed in the electrolyte kept at a prescribed temperature by the constant temperature bath. The anodization is conducted by application of a voltage between the specimen and the cathode from the power source. The electrolyte solution for the anodization includes solutions of oxalic acid, phosphoric acid, sulfuric acid, and chromic acid.

The hole interval, namely the structural repeating period in the anodized alumina is related roughly to the anodization voltage as shown by Equation (1) below. Therefore, the anodization voltage is preferably decided corresponding to the starting point arrangement (intervals).

$$2R = 2.5 \times Va \quad (1)$$

2R (nm): Hole repeating period
Va (volts): Anodization voltage

The thickness of the anodized alumina can be controlled by the thickness of the aluminum film and the time of anodization. For example, the entire thickness of the aluminum film can be converted into anodized alumina, or an intended thickness of the alumina film can be kept unconverted.

The diameter of the nanohole can be enlarged by immersion (hole widening treatment) of the anodized alumina layer in an acid solution (e.g., in a phosphoric acid solution). An intended nanohole diameter can be obtained by controlling the acid concentration, the treatment time, and the treatment temperature.

Further, the holes may be filled with a dielectric material, or a metal by a method of sol-gel, CVD, or electrodeposition. Such a treatment can be conducted within the series of a process preferably for simplification.

The filled dielectric material changes the dielectric constant of the hole portions, enabling control of the photonic band as mentioned before. For example, optical circuit can be formed as desired by filling a dielectric material in an intended filling pattern as shown in FIG. 8.

Figure 4A:
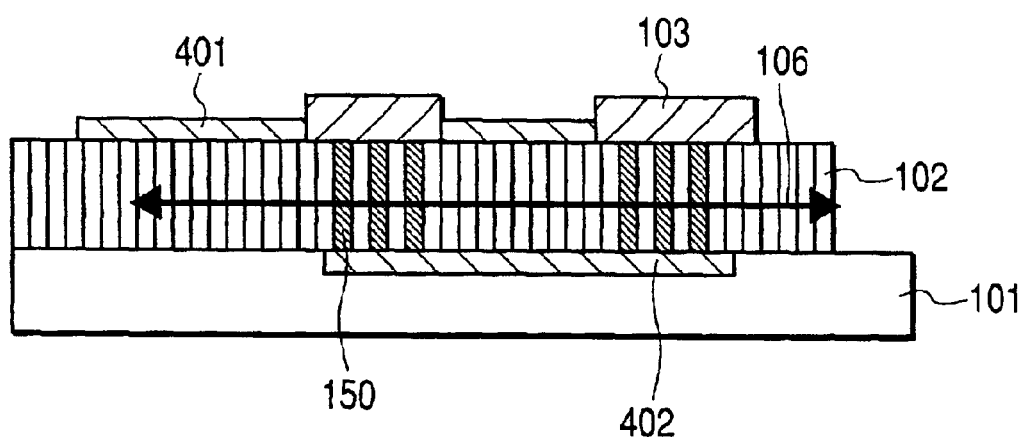
FIGS. 4A and 4B are sectional views illustrating a state of filling a conductive material into holes of the anodized alumina for wiring.
Figure 4B:
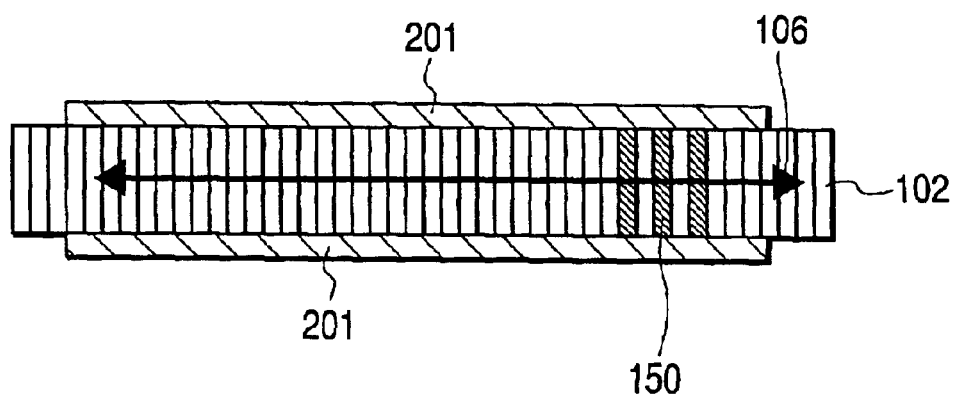

Filling of a metal in the holes enables electric connection between electronic device (an optical device) 103 placed on the upper face of anodized alumina 102 and wiring 402 placed on the lower face thereof as shown in FIGS. 4A and 4B. In FIGS. 4A and 4B, the numeral 150 indicates a via hole filled with a metal material such as Cu and Al.

FIG. 4A illustrates an example of electric connection by employing holes of anodized alumina 102 as contact holes between an upper electronic (or optical) device and lower electrode 402.

Figure 5A:
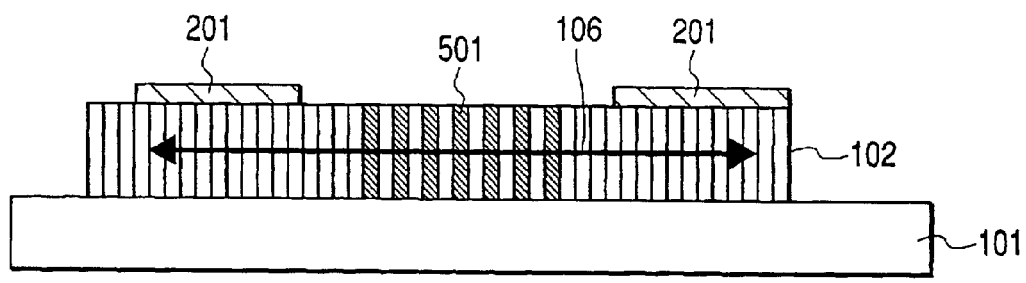
FIGS. 5A and 5B are sectional views illustrating a state of filling a conductive material into holes of the anodized alumina as an electromagnetic wave absorption layer.
Figure 5B:
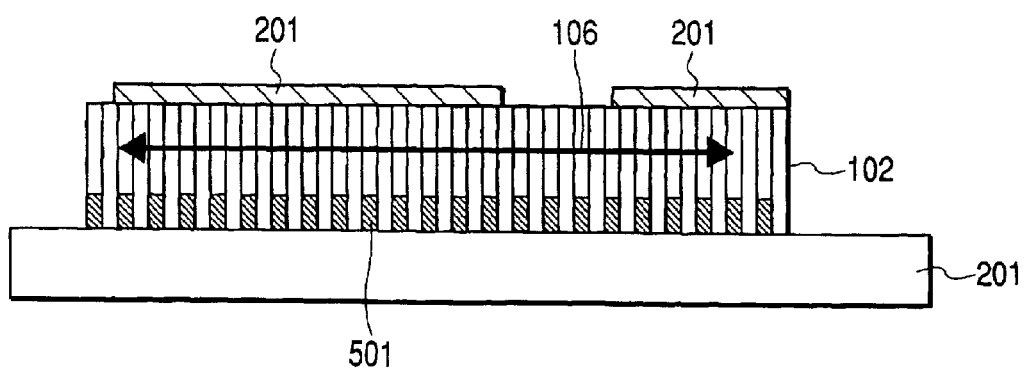

As other examples, as shown in FIGS. 5A and 5B, magnetic material 501 such as ferrite, Fe, Ni, and Co is filled into anodized alumina 102 as an electric wave absorber to prevent electric noise generation and to retard the influence of electromagnetic noise. FIG. 5A illustrates magnetic material 501 filled between electric circuits. FIG. 5B illustrates electric circuit 201 placed on anodized alumina filled with a magnetic material. The numeral 106 indicates schematically the transmission of light.

The use of aluminum as the base plate under the optical wiring layer as described in this embodiment is preferred in view of heat release. In recent years, heat removal from the devices is becoming an important problem with increase of the frequency of the electronic circuit, and increase of the speed and density of the signals. Accumulation of the generated heat may degrade the device properties, or may damage the electronic part. Therefore, the base plate should have higher heat-releasing ability, in particular, for power devices which will generate a larger amount of heat, or for optical devices which will be more sensitive to temperature. As the heat-releasing base plate other than the aluminum plate, the metal insulating base plates are useful which are disclosed in Japanese Patent Application Laid-Open No. 8-236885.

EXAMPLES

The present invention is described by reference to examples without limiting the invention. The present invention is not limited in the construction and the production process within the concept mentioned above.

Example 1

In this Example, anodized alumina was formed on an aluminum plate, and thereon an electric device and an optical device were mounted as illustrated in FIGS. 1A and 1B.

Firstly, on an aluminum plate, anodized alumina 102 was formed in a thickness of 5 µm. The remaining unanodized portion serves as base plate 101.

Prior to the anodization, hole-starting points (concaves) were formed on the surface of the aluminum plate by FIB irradiation. This enables the holes regularly arranged in a honeycomb state (triangular lattice state). In this example, a focused ion beam of Ga was projected to form hole-starting points in dots arranged in 360 nm intervals in triangular lattice arrangement, with ion species of Ga, at acceleration voltage of 30 kV, ion beam diameter of 100 nm, ion current of 300 pA, and irradiation time for each dot of 10 msec.

The anodization was conducted with an apparatus illustrated in FIG. 11, in a 0.3M phosphoric acid bath as the anodization electrolyte solution at anodization voltage of 144 V. Further, a hole-widening treatment was conducted by immersion in a 5 wt % phosphoric acid solution for 45 minutes to enlarge the nanohole diameter to about 100 nm.

On the anodized alumina, electroconductive paste like silver paste or copper paste was applied by screen printing to form a prescribed circuit pattern, and the electroconductive paste was baked or cured to form a circuit. Then electronic devices 103 and optical devices 105 were mounted to produce an optoelectronic wiring substrate. In the drawing, the numeral 104 indicates electronic wiring.

As the optical devices, a light-emitting device of InP type of 1.5 $\mu$m band, and a light-receiving device of InGaAs were employed.

By operating the electronic device and the optical device, it was confirmed that an optical circuit was formed through an optical waveguide composed of anodized alumina between the optical devices and the intended operation could be conducted. In this example, the anodized alumina served as an optical waveguide and an optical coupler. The optical wiring layer employed could solve the problem of EMI. An optoelectronic circuit was prepared on an aluminum base plate having high heat-releasing ability. In this Example, in the anodized alumina functioning as an optical wiring layer, light 106 was propagated in all directions of 360 degree with the light intensity varying in transmission direction depending on the triangular lattice arrangement of the holes.

Use of an optical wiring in semiconductor devices is disclosed, for example, in Japanese Patent Application Laid-Open Nos. 5-67770 and 6-308519. However, these methods employ a linear optical waveguide as the optical wiring, and employ a mirror or a prism for introduction or emission of light to or from the optical waveguide.

On the contrary, in the present invention, anodized alumina used as the optical coupler renders the mirror or the like unnecessary.

Example 2

In this Example, anodized alumina itself was used as the base plate as illustrated in FIG. 4B, and a device was provided on each of the upper and lower faces respectively, and some of the holes were utilized as via holes to connect electrically and optically the devices on the both faces.

Anodized alumina was fabricated in the same manner as in Example 1.

Anodization was conducted in a 0.3 M phosphoric acid solution bath as the electrolyte solution at an anodization voltage of 88 V. Further, a hole-widening treatment was conducted by immersion in a 5 wt % phosphoric acid solution for 40 minutes to obtain anodized alumina of hole intervals of 220 nm and hole diameter of about 100 nm. The remaining aluminum was dissolved by an aqueous mercury chloride to isolate the anodized alumina.

Subsequently, PMMA (poly-methyl-methacrylate) was filled into the holes to form a waveguide pattern. In this Example, the PMMA-filled holes serve as the waveguide as shown in FIG. 8. The non-filled portion was designed in its fine structure (hole spacing, and hole diameter) to lower the density of state on the photonic band structure.

On the both faces of the anodized alumina, electroconductive paste like silver paste or copper paste was applied by screen printing to form a prescribed circuit pattern, and the electroconductive paste was baked or cured to form a circuit. The electronic devices and optical devices were mounted to produce an optoelectronic wiring substrate. Some of the holes were filled with Cu. This Cu in the holes served to connect the electric wirings on the both faces As the optical devices, a light-emitting device of AlGaP type of 0.6 $\mu$m band, and a light-receiving device of Si were employed.

By operating the electronic device and the optical device, it was confirmed that an electronic circuit and an optical circuit were formed between the circuits on the both faces, and intended operation could be conducted. This Example shows that an optical circuit can be formed by utilizing the anodized alumina as the optical waveguide.

Example 3

In this Example, Fe was filled into fine holes of anodized alumina 102 to have a function of electromagnetic wave absorber 501 as shown in FIG. 5B. In this drawing, the magnetic material was filled into a part of thickness of the holes. Naturally, the magnetic material may be filled into the entire of the holes in the thickness direction, or may be filled only into the holes to be employed as the electromagnetic wave absorber.

Firstly, an Nb film, and an aluminum film were formed on an Si base plate. The aluminum film was converted to anodized alumina.

The anodized alumina was adjusted to have a thickness of 5 $\mu$m, hole spacings of 300 nm, and hole diameters of 100 nm. Into the holes of the anodized alumina, Fe was filled to a depth of about 1 $\mu$m by electrodeposition.

On the anodized alumina, an electric wiring was formed with electroconductive paste, and electronic devices and optical devices were mounted to obtain an optoelectronic wiring substrate. As the optical devices, a light-emitting device of GaAsN type of 1.3 $\mu$m band, and a light-receiving device of InGaAs were employed.

By operating the electronic devices and the optical devices, it was confirmed that an optical circuit was formed between the optical devices, and the intended operation could be conducted. The substrate of this Example had high noise immunity, and caused less electromagnetic noise.

Example 4

In this Example, anodized alumina was applied to an optical sheet as shown in FIG. 6.

In FIG. 6, the numeral 602 indicates a two-dimensional optical waveguide layer (hereinafter referred to as an "optical sheet"); 603, an IC having an optical I/O function formed on the surface thereof (e.g., CPU, RAM, or RF oscillator provided with an optical device); 604, an electric wiring formed on the surface; and 605, an optical wiring formed by light transmitted in the optical sheet.

In this Example, anodized alumina was employed as the optical sheet. The anodized alumina was placed on a PMMA base plate in the same manner as in Example 1. Into the holes, a polyimide was filled, except the region of the optical couplers. As shown in FIG. 3A, in the portion of the optical coupler for the optical device, the vacant holes not filled with the polyimide improved the coupling. With such optical couplers, the anodized alumina enabled emission or reception in multiple directions both in the light-emitting device and in the light-receiving device.

In FIG. 6, the electric signal output (CMOS logic) of LSI 603 provided with an optical I/O function can be transmitted through electric wiring 604 to the neighboring electronic devices. Otherwise, optical output signals generated by the optical I/O devices can be transmitted through optical waveguide (optical sheet) 602 as the optical wiring. Either method may be choose to be employed depending on the cases.

The logic signals of LSI (e.g., 3.3 V for CMOS) has a sufficient voltage for driving the aforementioned optical device. An electric signal can be converted to an optical signal by applying a logic signal as a forward bias to the optical device.

In this operation, the light, which is emitted in multiple directions, propagates over the entire optical sheet without a special optical system In this Example, the efficiency of coupling to the waveguide is 40% or higher.

(Signal Receiving Function)

Conversely, an input signal introduced in an arbitrary direction to optical sheet 602 is received by the light-receiving element and is converted to electric signal. The converted electric signal is taken in by the neighboring LSI 603 to be processed. In this operation, CMOS-compatible voltage can be restored by integrating preamplifiers for amplifying the electric signal with the light-receiving element.

Therefore, the present invention solves simultaneously the problems of wiring delay and the EMI which cannot be solved by simple electric wiring.

Example 5

An application example of clock signal transmission employing another optical sheet is explained below.

Plural electronic parts (CPU, memory, etc.) 603 and optical devices are mounted on a base plate, and a part of the wirings are coupled by the optical devices to the base plate in the same manner as in Example 4.

In this Example, LSI 603 provided with an optical I/O function is a clock generator. The clock signal is converted to an optical signal through an optical device, and is transmitted through the optical sheet to all the devices on the base plate. Any electronic device (e.g., MPU) on the base plate, which has also an optical device, receives the optical signal from the clock generator. Another device (e.g., RAM) can also receive the clock signal in a similar manner, and can be driven by the common clock.

Conventionally, in distribution of clock signals to individual devices, wiring delay owing to limitation in selection of the wiring pattern or unavoidable unequal wiring distances or EMI owing to a high-speed large-current operation are not negligible. However, the present invention solves such problems simultaneously.

Example 6

In this Example, the Si layer of an SOI base plate was worked to have a periodic structure fabricated by a lithography technique for formation of a two-dimensional optical waveguide and an optical coupler. Incidentally, the SOI base plate is a base plate which has a silicon layer on an insulating base plate.

Firstly an SOI base plate was worked by an electron-beam lithography technique and a dry etching technique to obtain a two-dimensional periodic structure of the Si layer. The thickness of the Si layer was 2 μm. The obtained photonic crystal structure had a periodic structure in which columnar holes of 0.55 μm in diameter were arranged at intervals of 0.65 μm in a triangular lattice periodic pattern.

On this base plate, an electric circuit was formed by vacuum vapor deposition. The electronic devices and optical devices were mounted thereon to obtain an optoelectronic wiring substrate. The optical devices employed light emitting device of InP type of 1.5 μm band, and a light-receiving device of InGaAs.

In this Example, structural anisotropy of the optical waveguide having a periodic structure, namely the two-dimensional photonic crystal, enables selective light propagation in a designed direction (e.g., six directions of symmetry of a triangular lattice arrangement). This enables routing for connection between optical devices. The limitation of the light propagation direction lowers freedom degree of positioning of the optical device, but increases effectiveness in use of the light in comparison with the light propagation in all directions of 360 degree, broadening the application range of the two-dimensional optical waveguide (applicability to a larger size of optical waveguides).

By operating the electronic devices and the optical devices, it was confirmed that an optical circuit was formed between the optical devices, and the intended operation could be conducted. The substrate of this Example had high noise immunity, and caused less electromagnetic noises. In this Example, a semiconductor circuit can be integrated on the silicon layer of the SOI base plate.

Example 7

In this Example, a three-dimensional periodic structure was provided in which polystyrene spheres are arranged as an optical coupler.

Figure 14:
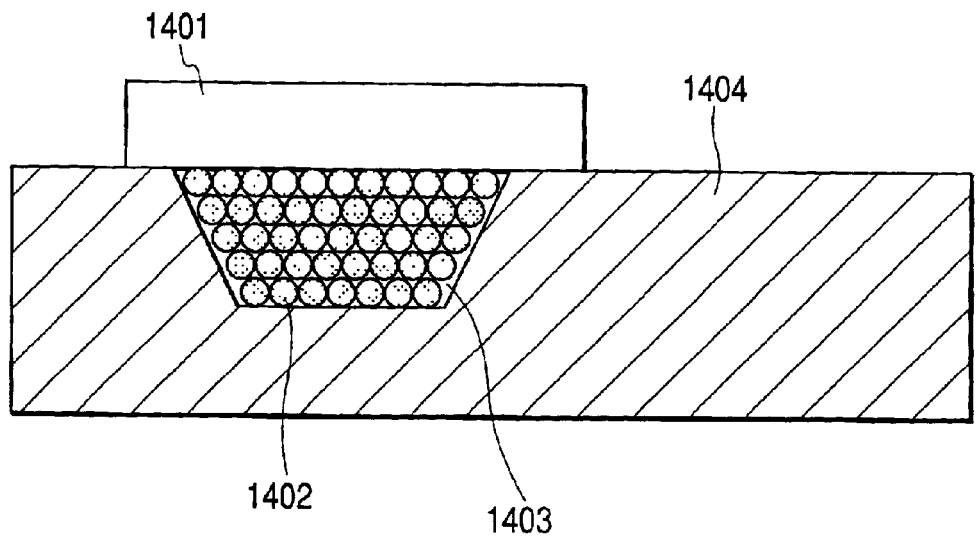
FIG. 14 illustrates application of the periodic structure to an optical junction.

Firstly, on Si base plate 1404, tapered holes 1403 of 100 μm∈ were formed by photolithography and anisotropic wet etching (see FIG. 14). In the tapered holes, polystyrene spheres 1402 of 350 nm in diameter were placed as shown in FIG. 14. Thereon, optical devices 1401 were mounted. The polystyrene spheres came to be packed closest automatically and regularly in the holes of the Si. FIG. 14 is an enlarged sectional view of the mounted optical device and the neighboring portion thereof.

On the base plate, an electric circuit was formed by vapor deposition, and then electronic devices and optical devices were mounted thereon to provide an optoelectronic wiring substrate. As the optical devices, a light-emitting device of InP type of 1.5 μm band, and a light-receiving device of InGaAs were employed, and were mounted on the tapered holes.

The light from the optical device was confirmed to be coupled effectively through the optical coupler constituted of aggregate of the polystyrene spheres to the two-dimensional optical waveguide, namely the Si base plate. Thus, effective optical coupling could be achieved by placing the 3D photonic crystal, a dispersion of polystyrene spheres, as the optical coupler.

By operating the electronic devices and the optical devices, it was confirmed that an optical circuit was formed between the optical devices, and the intended operation could be conducted.

The feature of the optoelectronic substrate of the present invention has characteristics that effective optical coupling can be achieved by a relatively simple method with high freedom in designing the optical wiring. Further, the intended patterning could be achieved by a relatively simple technique of embedding of a resin material.

Example 8

In this Example, an optoelectronic substrate was provided which employs a two-dimensional optical waveguide having three-dimensional periodic structure.

The three-dimensional periodic structure was prepared by femtosecond laser processing. The femtosecond laser was a Ti:sapphire laser of wavelength of 800 nm. By projecting and focusing the laser beam pulse at a pulse width of 150 fs on a quartz glass plate, the refractive index at and around the focused point is changed. Thereby, a two-dimensional waveguide was prepared in which bits of about 300 nm diameter having a changed refractive index were three-dimensionally arranged: at periodic bit intervals of 500 nm, in graphite lattice arrangement, bit layer spacings of 500 nm, constructed of 12 layers, with the quartz base plate thickness of 0.1 mm.

On the base plate, an electric circuit was formed by vacuum deposition. Then hollows for mounting optical devices were formed by YAG laser processing at a hollow size of 150 $\mu$m and a depth of 50 $\mu$m. Into the hollows, a GaAlAs laser of 0.85 $\mu$m band and a light-receiving device of Si were mounted. Further electronic devices were mounted thereon to obtain an optoelectronic wiring substrate.

In application of this optical guide as a two-dimensional optical waveguide, the light spread uniformly over the entire of the waveguide, even in the local presence of vias and devices. Therefore, an optical circuit can be formed, even in the case where a straight light path is hindered by a via or the like. In other words, even when a via or a device is present within the two-dimensional optical waveguide, light can be received at any point relatively uniformly in the light quantity, whereby an optoelectronic substrate can be obtained which does not disturb the optical wiring. Thereby, freedom and reliability in optical wiring are improved.

Example 9

In this Example, defects 1526 were provided to strengthen optical coupling between an optical device and an optical waveguide (see FIG. 15).

The constitution of the substrate was the same as that in Example 1 except that holes having a different hole diameter were formed as shown in FIG. 15. The control of the hole diameter was conducted by controlling the depth of the hole-starting points. Specifically, a larger hole is formed at a deeper hole-initiation point by a larger FIB irradiation quantity, whereas a smaller hole is formed at a shallower hole-starting point by a smaller FIB irradiation quantity. Such a control of the fine structure strengthens the optical coupling. Such a constitution gives high freedom in designing an optical circuit without retarding light propagation in all directions of 360o, a characteristic of the optical circuit employing the two-dimensional waveguide. Incidentally, in FIG. 15, the numeral 1521 indicates a first dielectric material, and the numeral 1522 indicates a second dielectric material.

Example 10

In this Example, optoelectronic substrates described in Example 2 were bonded to form a lamination to prepare a high-density optoelectronic substrate.

The regions of the 2D waveguide (optical sheet) were formed at prescribed portions by filling the fine pattern of the anodized alumina of each of the layers with a polycarbonate resin. In the respective regions, the light could propagate in 2D directions without hindrance. On the other hand, the outside thereof became a photonic crystal to prevent the propagation. Similarly, line waveguides could be formed. Thus an optoelectronic substrate was prepared which was constituted of layers having different shapes of 2D waveguides. Thereby, the freedom in design of the optical wiring was increased further.

The optoelectronic substrate in this Example is characterized in that the lamination enables a high density mounting of the substrate by lamination, and the freedom in design of the optical wiring was very high. The patterning can be conducted relatively simply by burying of a resin material.

(Effect of the Invention)

As described above the present invention provides a substrate which does not cause EMI.

What is claimed is:

1. An circuit substrate comprising:

plural optical devices; and an optical interconnecting layer which is an optical waveguide comprising a photonic crystal, and wherein the photonic crystal transmits an optical signal in plural transmission directions.

2. The circuit substrate according to claim 1, wherein the photonic crystal is comprised of a periodic structure having a repeating period smaller than the wavelength of light employed for optical coupling between the optical device and the optical interconnecting layer.

3. The circuit substrate according to claim 1, wherein the optical device for receiving the light propagated through the optical interconnecting layer receives light from plural directions in the optical interconnecting layer.

4. The circuit substrate according to claim 1, wherein the photonic crystal is comprised of alumina.

5. The circuit substrate according to claim 1, wherein each said optical device is a light-receiving element, and at least a part of a light-receiving region of each light-receiving element is implanted in the optical wiring layer.

6. An circuit substrate comprising an electronic device, an optical device, and an optical interconnecting layer, wherein at least a part of the optical interconnecting layer is comprised of anodized alumina employed as a two-dimensional optical waveguide which transmits an optical signal in plural transmission directions.

7. The circuit substrate according to claim 6, wherein the anodized alumina is employed as an optical coupler between the optical device and the optical wiring layer.

8. The circuit substrate according to claim 6, wherein the anodized alumina has a periodic structure in which holes are arranged two-dimensionally in a triangular lattice arrangement.

9. The circuit substrate according to claim 6, wherein the anodized alumina has plural holes, and at least a part of the holes are filled with a dielectric material.

10. The circuit substrate according to claim 6, wherein the anodized alumina has plural holes, at least a part of the holes are filled with an electroconductive material, and the electroconductive material is electrically connected to the electronic device or the optical device.

11. The circuit substrate according to claim 6, wherein the anodized alumina has plural holes, and at least a part of the holes are filled with a magnetic material.

12. The circuit substrate according to claim 6, wherein the anodized alumina is provided on an aluminum base plate.

13. An circuit substrate comprising an electronic device, an optical device, and an optical interconnecting layer which is a two-dimensional optical waveguide comprised of a periodic structure having a repeating period nearly equal to or smaller than the wavelength of light employed for signal transmission, and which transmits an optical signal in plural transmission directions.

14. An circuit substrate comprising an electronic device, an optical device, an electric wiring connected to the electronic device, an optical interconnecting layer, and a base plate, wherein the optical interconnecting layer is employed as an insulating layer between the base plate and the electric wiring and comprises a two-dimensional optical waveguide which transmits an optical signal in plural transmission directions.

15. A substrate comprising:

a first optical device for emitting an optical signal;

a second optical device for receiving the optical signal from the first optical device; and an optical layer transmitting the optical signal emitted from the first optical device to the second optical device, wherein the optical layer comprises a photonic crystal, and the optical layer transmits the optical signal from the first optical device in plural transmission directions.

16. The substrate according to claim 15, further comprising:

an electronic device which controls the optical communication between the first and second optical device.

* * * * *

UNITED STATES PATENT AND TRADEMARK OFFICE
CERTIFICATE OF CORRECTION

PATENT NO. : 6,936,854 B2
DATED : August 30, 2005
INVENTOR(S) : Tatsuya Iwasaki et al.

It is certified that error appears in the above-identified patent and that said Letters Patent is hereby corrected as shown below:

<u>Title page</u>,
Item [56], References Cited, U.S. PATENT DOCUMENTS, insert
-- 6,416,575   7/2002   Yamada   117/2
   6,477,286   11/2002   Ouchi   385/14
   6,358,653   3/2002   Tuberfield et al.   430/16
   6,064,506   5/2000   Koops   359/237 --.
OTHER PUBLICATIONS,
"H. Masuda et al.," reference, "Alumin,"" should read -- Alumina, --; and insert
-- IBM Technical Disclosure Bulletin; Vol. 26, No. 4, dated September 1983
(p. 1793-1796). --.

<u>Column 2</u>,
Line 2, "an" should read -- a --; and
Line 54, "alumna" should read -- alumina --.

<u>Column 4</u>,
Line 2, "101:" should read -- 101, --.

<u>Column 5</u>,
Line 33, "degree" should read -- degrees --;
Line 55, "as" should read -- as a --; and
Line 56, "elements" should read -- element --.

<u>Column 7</u>,
Line 30, "fubricate" should read -- fabricate --; and
Line 56, "by" should read -- for --.

<u>Column 8</u>,
Line 24, "disadvantage" should read -- disadvantages --.

<u>Column 9</u>,
Line 13, "is" should read -- are --.

<u>Column 10</u>,
Line 58, "priodically" should read -- periodically --.

<u>Column 11</u>,
Line 48, "include" should read -- includes --.

UNITED STATES PATENT AND TRADEMARK OFFICE
CERTIFICATE OF CORRECTION

PATENT NO. : 6,936,854 B2
DATED : August 30, 2005
INVENTOR(S) : Tatsuya Iwasaki et al.

It is certified that error appears in the above-identified patent and that said Letters Patent is hereby corrected as shown below:

Column 13,
Line 36, "degree" should read -- degrees --.

Column 14,
Line 5, "On the" should read -- On --;
Line 18, "on the" should read -- on --; and
Line 30, "entire of the" should be deleted.

Column 15,
Line 12, "choose" should read -- chosen --; and
Line 21, "system" should read -- system. --.

Column 16,
Line 23, "degree," should read -- degrees, --; and
Line 39, "$\mu$me" should read -- $\mu$m --.

Column 17,
Line 57, "306o" should read -- 360° --.

Column 18,
Lines 22 and 44, "An" should read -- A --.

Column 19,
Lines 3 and 10, "An" should read -- A --.

Signed and Sealed this

Twenty-fourth Day of January, 2006

JON W. DUDAS
*Director of the United States Patent and Trademark Office*